United States Patent
Duffar et al.

(10) Patent No.: US 6,554,895 B2
(45) Date of Patent: Apr. 29, 2003

(54) CRYSTALLOGENESIS METHOD WITH MAGNETIC FIELD

(75) Inventors: Thierry Duffar, Grenoble (FR); Jean-Paul Garandet, Grenoble (FR)

(73) Assignee: Comissariat a l'Energie Atomique (FR)

( * ) Notice: Subject to any disclaimer, the term of this patent is extended or adjusted under 35 U.S.C. 154(b) by 0 days.

(21) Appl. No.: 09/884,761

(22) Filed: Jun. 19, 2001

(65) Prior Publication Data
US 2001/0052315 A1 Dec. 20, 2001

(30) Foreign Application Priority Data
Jun. 20, 2000 (FR) .............................. 00 07841

(51) Int. Cl.[7] .............................................. C30B 25/04
(52) U.S. Cl. ............................. 117/82; 117/29; 117/81; 117/83; 117/917
(58) Field of Search .............................. 117/29, 37, 38, 117/39, 48, 917, 81, 83

(56) References Cited

U.S. PATENT DOCUMENTS

| | | | |
|---|---|---|---|
| 3,203,768 A | 8/1965 | Tiller et al. ................... | 23/273 |
| 6,228,165 B1 * | 5/2001 | Baba et al. .................... | 117/29 |

FOREIGN PATENT DOCUMENTS

| | | | |
|---|---|---|---|
| EP | 0178987 | 4/1986 | ........... C30B/13/02 |
| EP | 0787838 | 8/1997 | ........... C30B/15/30 |

OTHER PUBLICATIONS

"Seedless THM growth of CdxHgl–xTe (x=0.2) single crystals within rotating magnetic field",by A.S. Senchenkov, et al., Journal of Crystal Growth, vol. 197, 1999, pp. 552–556.

"CdTe and CdTe0.9Se0.1 crystals grown by the travelling heater method using a rotatin magnetic field", by M. Salk, et al., Journal of Crystal Growth, vol. 138, 1994, pp. 161–167.

"Bridgman crystal growth with a strong, low–frequency, rotating magnetic field", by J.S. Walker, Journal of Crystal Growth, vol. 192, 1998, pp. 318–327.

Distribution and genesis of inclusions in CdTe and (Cd,Zn) Te single crystals grown by the Bridgman method and by he travelling heater method, by P. Rudolph, et al., Journal of Crystal Growth, vol. 147, 1995, pp. 297–304.

"The crystal perfection depends on the superheating of the mother plase too—experimental facts and speculations on the "melt structure" of semiconductor compounds", by P. Rudolph, et al., Journal of Crystal Growth, vol. 166, 1996, pp. 578–582.

"Modification of Fluid Flow and Heat Transport in Vertical Bridgman Configurations by Rotating Magnetic Fiels", by P. Dold, et al., in Cryst. Res. Technol., vol. 32, 1997, 1, pp. 51–60.

"Rotating magnetic fields: fluid flow and crystal growth applications", by P. Dold, et al., Progress in Crystal Growth and Characterization of Materials, 1999, pp. 7–38.

* cited by examiner

Primary Examiner—Felisa Hiteshew
(74) Attorney, Agent, or Firm—Hayes Soloway, P.C.

(57) ABSTRACT

A method for manufacturing a solid single crystal of an electrically conductive material by pulling from a molten mass of this material, the material presenting atom clusters at melt. The method includes: a melt stage so as to obtain a molten mass, the melt stage procuring a colder zone of the molten mass, from which the single crystal will be pulled, and a hotter zone having sufficient temperature to melt the atom clusters; a stage of application to the molten mass of a rotating magnetic field allowing the atom clusters to be displaced from the colder zone to the hotter zone; and a stage of growth by pulling of the single crystal after the atom clusters have been displaced from the colder zone to the hotter zone.

14 Claims, 2 Drawing Sheets

CRYSTALLOGENESIS METHOD WITH MAGNETIC FIELD

TECHNICAL FIELD

The present invention relates to the controlled solidification of a material from a liquid in order to obtain a single crystal. It relates in particular to mono-directional solidification in a crucible by Bridgman or "Gradient Freeze" pulling methods. It is particularly well adapted to the growth of compound materials of type II–VI or IV–VI.

PRIOR ART

According to Bridgman or "Gradient Freeze" methods of directional crystal growth, the product to be crystallised is introduced into a crucible at the bottom of which a seed may previously have been introduced. After the product to be solidified (but not the seed) has been melted in an oven, the next step is to grow the crystal either by mechanically displacing the crucible in a temperature gradient, or by slowly cooling the oven. If the pulling or cooling speeds and the temperature gradient are optimised, a single crystal is generally obtained.

There are however categories of materials capable of applications in single crystal form and for which it is impossible to obtain single crystals since grains and twins appear during crystal growth. These are materials known under the generic names II–VI and IV–VI since they are constituted by alloys of elements belonging respectively to columns II and VI or IV and VI of the Mendeleiev table. The explanation for this phenomenon lies in the fact that, after melting, the liquid includes atom "clusters" which, during solidification, are deposited anarchically on the growth interface and modify the crystal orientation. Reference may be made on this subject to the article "The crystal perfection depends on the superheating of the mother phase too—experimental facts and speculations on the 'melt structure' of semiconductor compounds" by P. RUDOLPH et al., in Journal of Crystal Growth, 166 (1996), pages 578 to 582.

As the material melts, corresponding to the destruction of the crystalline network, the material is not separated into isolated molecules. These molecules remain cohered in clusters thus giving a certain crystal orientation, which differs from one cluster to another. These clusters accumulate at the bottom of the liquid part, near the solid-liquid interface where they have just been created. If the liquid is re-solidified, the clusters are incorporated into the solid according to a random crystallographic orientation, which constitutes so many sources of disorientation preventing a single crystal from being obtained.

These clusters may be destroyed by superheating the liquid up to a certain temperature above the melt temperature (for example a superheating of 25° C. in the case of CdTe). In practice, it is however necessary for all the liquid to be superheated, which is not guaranteed by the natural convection prevailing in the liquid, this convection not being sufficiently strong to displace the clusters located in the colder zone of the liquid, i.e. immediately above the solid-liquid interface.

Using a rotating magnetic field during solidification of the material has been proposed in order to stabilise natural convection in such a way that fluctuations in temperature and associated fluctuations in chemical composition are reduced. Reference may be made in this matter to the articles by P. DOLD and K. W. BENZ entitled "Modification of Fluid Flow and Heat Transport in Vertical Bridgman Configurations by Rotating Magnetic Fields", in Cryst. Res. Technol. 32 (1997), 1, pages 51 to 60 and "Rotating Magnetic Fields: Fluid Flow and Crystal Growth Applications" in Progress in Crystal Growth and Characterization of Materials (1997), pages 7 to 38.

DISCLOSURE OF THE INVENTION

The present invention makes it possible to overcome current problems in obtaining single crystals of compound materials of type II–VI and IV–VI of electronic quality. It consists in using a rotating magnetic field to displace the atom clusters in a part of the melting bath where the temperature is highest. The clusters melt in this part of the bath while the temperature field in the vicinity of the liquid-solid interface continues to be adapted to growth.

Contrary to the prior art mentioned above, the magnetic field is not used to homogenise temperature and chemical composition in the melting bath. The object of the method according to the invention is in a way to force natural convection instead of stabilising it. To do this, a rotating magnetic field according to the invention is applied before solidification starts while, in the prior art, the magnetic field exerts its action when the bath is depleted of one of the constituents of the mix, i.e. during growth.

The object of the invention therefore is a method for manufacturing a solid single crystal from a material which is electrically conductive in the molten state, by pulling from a molten mass of this material, the material presenting clusters at melt, the method including:

a melt stage so as to obtain said molten mass, the melt stage procuring a colder zone of the molten mass, from which the single crystal will be pulled, and a hotter zone having sufficient temperature to melt the atom clusters, a stage of application to the molten mass of a rotating magnetic field allowing the atom clusters to be displaced from the colder zone to the hotter zone, a stage of growth by pulling of the single crystal after the atom clusters have been displaced from the colder zone to the hotter zone, the single crystal being formed from the end of the molten mass located near the colder zone.

To advantage, the melt stage procures a hotter zone representing more than half the volume of the molten mass.

Preferably, pulling is performed along a vertical axis. In this event, the colder zone of the molten mass may constitute its lower part whereas the hotter zone may constitute its upper part.

Preferably, the melt stage is conducted so that there is a steady temperature variation between the temperature of the colder zone and the temperature of the hotter zone.

To advantage, the characteristics of the magnetic field are such that the hydrodynamic boundary layer, located near the liquid-solid interface is reduced as much as possible.

The pulling of the single crystal may be carried out by the Bridgman method or the method known by the name of the "Travelling Heater Method" or THM.

The invention applies particularly to the manufacture of a single crystal of a material selected from materials of type II–VI and IV–VI.

BRIEF DESCRIPTION OF DRAWINGS

The invention will be better understood and other advantages and particularities will emerge by reading the following description, given as a non-restrictive example, accompanied by the appended drawings among which.

DETAILED DESCRIPTION OF ONE EMBODIMENT OF THE INVENTION

The invention consists in using, before solidification, a rotating magnetic field to create a forced convection and displace the atom clusters located in the cold liquid zone to the hot liquid zone where they are destroyed by thermal agitation. Solidification may then occur.

The effect of the convective motion created by the magnetic field is twofold. On the one hand it ensures faster and more homogenous movement of the liquid than natural convection, a fact which allows the atom clusters to disappear more quickly. On the other hand, and this is the most important effect for the invention, the geometric and hydrodynamic characteristics of the convective motion mean that it is particularly effective in respect of displacing the atom clusters located near the liquid-solid interface. Indeed, the fluid speed due to the magnetic field is at its highest only a few millimeters above the interface. In the case of natural convection, it is more a matter of centimeters.

The remainder of the description will bear on the implementation of the invention by means of a conventional Bridgman oven to which is added a device able to produce a rotating magnetic field. This may be to advantage effected at little cost from an electric motor stator.

The temperature produced by the oven is such that there is in the molten mass a hotter zone, of volume greater than half the molten mass and superheated by at least a certain temperature range above the melt temperature of the material. This temperature range may be at least 25° C. if the material is CdTe. Before solidification, the applied rotating magnetic field allows homogenisation of the colder zone of the molten mass, for a period of time which depends on the nature of the material to be solidified. This period may be one hour for CdTe.

Figure 1:
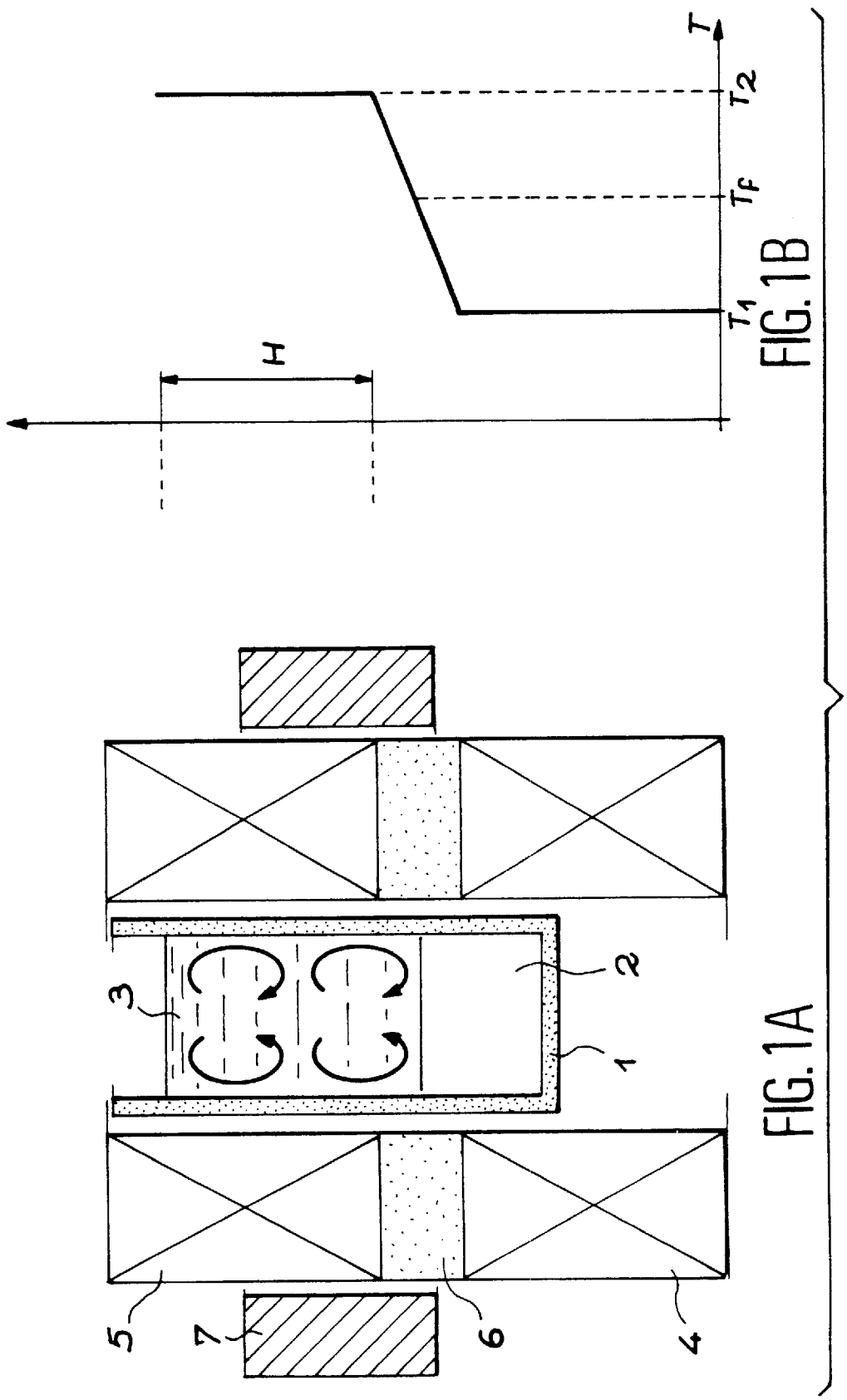
FIG. 1A shows diagrammatically and in longitudinal cross-section a device for implementing the method according to the invention.
FIG. 1B shows a diagram showing the variation in temperature in the device along its longitudinal axis.

FIG. 1A shows a cylindrical crucible 1, at the bottom of which has been placed a seed 2. Over the seed 2 is placed the material 3 from which it is wished to manufacture the single crystal. The crucible 1 is placed in an oven constituted of two heating parts 4 and 5 separated by a thermally insulating zone 6 so as to obtain within the crucible 1 the temperature profile T shown in FIG. 1B.

The temperature profile established during the melt stage of the material is centred on the melt temperature $T_f$ of the material. It is the temperature which prevails in the crucible 1 in the part, of the molten mass which is just in contact with the seed 2. The heating part 4 produces the temperature $T_1$ below the material melt temperature. The heating part 5 produces the temperature $T_2$ above the material melt temperature. At this stage of the method, the material 3 constitutes a molten mass having an upper so-called hot zone, of height H and of temperature $T_2$ sufficiently distant from the melt temperature $T_f$.

The electromagnet 7 allows a rotating magnetic field to be created which induces in the electrically conductive molten mass an azimuthal and meridional motion. This motion is shown by arrows in the material 3.

Figure 2:
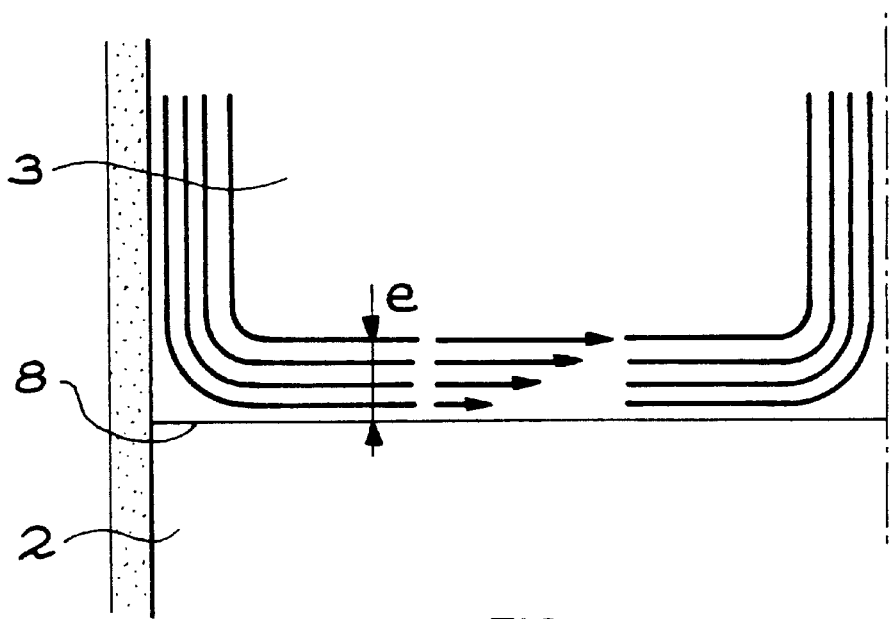
FIGS. 2 and 3 show the lines of convection at liquid-solid interface level, for the method according to the invention and for the prior art method respectively.
Figure 3:
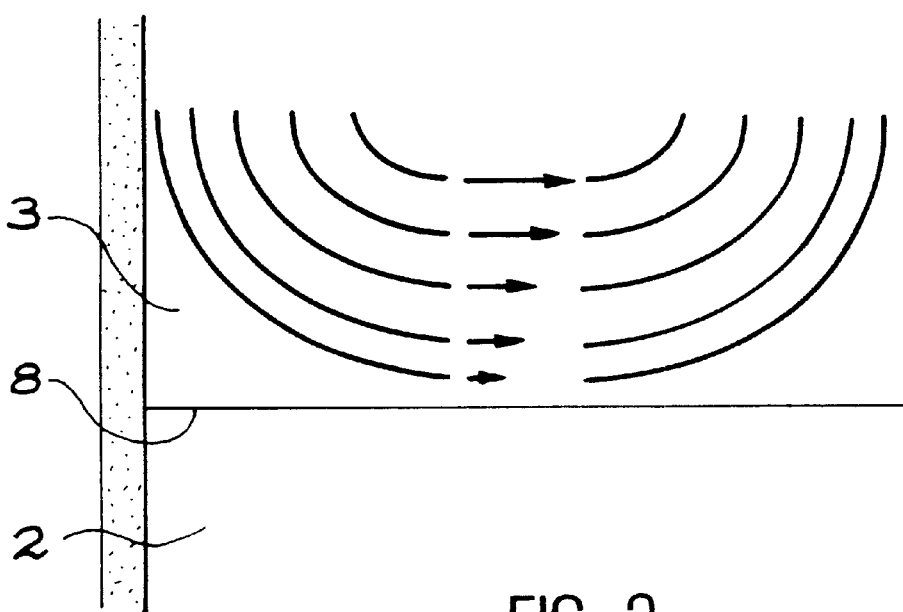

FIGS. 2 and 3 are partial views, and on one side of the longitudinal axis of symmetry of the device, showing the interface 8 between the seed 2 and the material 3. FIG. 2 corresponds to the case where a rotating magnetic field is applied to the material 3, in accordance with the invention. FIG. 3 corresponds to the conventional case where no magnetic field is applied. For these two figures, the lines of convection have been shown. Comparison of these two figures shows well the influence of a rotating magnetic field on the lines of convection. It may be noted that the current of liquid due to convection penetrates nearer the interface in the presence of a rotating magnetic field than in its absence, which allows a higher flow of atom clusters towards the hot zone.

For industrial implementation, the following considerations may be taken into account. The capacity for transporting atom clusters by a rotating magnetic field is proportionate to the product of the characteristic speed induced in the fluid by the mixing time, which represents the average distance covered by the atom clusters. A criterion may be set whereby, if this distance is about ten times the half-length of the zone, the existing atom clusters will be destroyed. The mixing time is a parameter selected by the operator, and the characteristic speed of the fluid V depends primarily on the intensity B of the magnetic field and on its pulse ω according to the following formula:

$$V=(\sigma\omega/2\rho)^{1/2}BR$$

σ and ρ representing electrical conductivity and the fluid density respectively, R the crucible radius. For parameters characteristic of a CdTe growth experiment ($\sigma=5000\ \Omega^{-1}m^{-1}$, $\rho=5640\ kg.m^{-3}$, R=2.5 cm), a moderated field B=10 mT rotating at a frequency of 50 Hz induces a speed V of the order of 3 mm/s. For a liquid zone half-length of 20 cm, it would therefore only be necessary to apply the rotating magnetic field for a period of 10 minutes before the start of pulling to ensure the destruction of the atom clusters.

It may be noted then that the fluid speed is 3 mm/s in the case of the invention whereas it is of the order of 0.4 mm/s in the absence of an applied rotating magnetic field.

However, it may be calculated that the layer of thickness e shown in FIG. 2, wherein the fluid speed is decreasing and is therefore less and less effective, has a thickness of 2 mm. In order to allow the atom clusters to be displaced in this layer by thermal agitation, it is necessary to bring the agitation time of the molten sample to 1 hour. This time may be reduced by increasing the magnetic field: with 25 mT, the layer has a thickness of one mm (it varies in $B^{2/3}$) and the time may be reduced to ¼ hour (it varies in $e^2$).

The invention may be applied to the manufacture of single crystals of compounds II–VI and IV–VI, such as CdTe, HgTe, PbTe, ZnSe and their alloys. It may also be applied to other methods of growing these compounds from a liquid, in particular the "Travelling Heater Method" or THM which consists in displacing a molten zone, in a crucible, between two solid parts.

The main advantage brought by the invention is linked to the possibility of obtaining single crystals, whereas this is impossible in the current state of affairs for materials such as CdTe for example.

Compared with the use of a rotating magnetic field in the prior art mentioned above, the present invention has the following differences. The magnetic field is used prior to solidification and not during solidification. The implementation of the method of the invention therefore implies the existence of an additional stage. Another difference lies in the fact that the characteristics of the magnetic field (amplitude, pulse) are optimised above all so as to reduce as much as possible the hydrodynamic boundary layer located near the interface. Applications published previously optimise the magnetic field to stabilise natural convection, which leads to different choices of parameters.

What is claimed is:

1. A method for manufacturing a solid single crystal of an electrically conductive material by pulling from a molten mass of this material, the material presenting atom clusters at melt, the method comprising:

a melt stage for forming said molten mass, the melt stage producing a colder zone of the molten mass, from which the single crystal will be pulled, and a hotter zone having sufficient temperature to melt the atom clusters;

a stage for applying to the molten mass a rotating magnetic field allowing the atom clusters to be displaced from the colder zone to the hotter zone; and a stage for growing by pulling single crystal after the atom clusters have been displaced from the colder zone to the hotter zone, the single crystal being formed from an end of the molten mass located near the colder zone.

2. A method according to claim 1, wherein the melt stage produces a hotter zone in more than half the volume of the molten mass.

3. Application of the method according to claim 2 to the manufacture of a single crystal of a material selected from II–VI and IV–VI compounds.

4. A method according to claim 2, wherein the pulling is conducted along a vertical axis.

5. A method according to claim 4, wherein the colder zone of the molten mass comprises the lower part of the molten mass, whereas the hotter zone comprises the upper part of the molten mass.

6. Application of the method according to claim 5 to the manufacture of a single crystal of a material selected from II–VI and IV–VI compounds.

7. Application of the method according to claim 4 to the manufacture of a single crystal of a material selected from II–VI and IV–VI compounds.

8. A method according to claim 1, wherein the melt stage is performed so that there is a steady temperature variation between the temperature of the colder zone and the temperature of the hotter zone.

9. Application of the method according to claim 8 to the manufacture of a single crystal of a material selected from II–VI and IV–VI compounds.

10. A method according to claim 1, wherein the magnetic field is applied so that a hydrodynamic boundary layer, located near the liquid-solid interface is reduced to a minimum.

11. Application of the method according to claim 10 to the manufacture of a single crystal of a material selected from II–VI and IV–VI compounds.

12. Application of the method according to claim 11 to the manufacture of a single crystal of a material selected from II–VI and IV–VI compounds.

13. A method according to claim 1, wherein the pulling of the single crystal is performed by the Bridgman method or the THM method.

14. Application of the method according to claim 1 to the manufacture of a single crystal of a material selected from II–VI and IV–VI compounds.

* * * * *

UNITED STATES PATENT AND TRADEMARK OFFICE
CERTIFICATE OF CORRECTION

PATENT NO. : 6,554,895 B2
DATED : April 29, 2003
INVENTOR(S) : Duffar et al.

It is certified that error appears in the above-identified patent and that said Letters Patent is hereby corrected as shown below:

<u>Column 5,</u>
Line 27, "2" should read -- 1 --.

<u>Column 6,</u>
Line 21, "11" should read -- 13 --.

Signed and Sealed this

Eighteenth Day of May, 2004

JON W. DUDAS
*Acting Director of the United States Patent and Trademark Office*